US011306029B2

(12) United States Patent
Eto et al.

(10) Patent No.: US 11,306,029 B2
(45) Date of Patent: Apr. 19, 2022

(54) ALUMINA SINTERED BODY, METHOD FOR MANUFACTURING THE SAME, AND PART FOR SEMICONDUCTOR MANUFACTURING APPARATUS

(71) Applicant: FERROTEC MATERIAL TECHNOLOGIES CORPORATION, Tokyo (JP)

(72) Inventors: Shunichi Eto, Tokyo (JP); Osanobu Fukuo, Tokyo (JP); Kiyotaka Saitou, Tokyo (JP)

(73) Assignee: FERROTEC MATERIAL TECHNOLOGIES CORPORATION, Tokyo (JP)

( * ) Notice: Subject to any disclaimer, the term of this patent is extended or adjusted under 35 U.S.C. 154(b) by 45 days.

(21) Appl. No.: 16/635,937

(22) PCT Filed: Jul. 31, 2018

(86) PCT No.: PCT/JP2018/028547
§ 371 (c)(1),
(2) Date: Jan. 31, 2020

(87) PCT Pub. No.: WO2019/026871
PCT Pub. Date: Feb. 7, 2019

(65) Prior Publication Data
US 2020/0239368 A1 Jul. 30, 2020

(30) Foreign Application Priority Data
Aug. 1, 2017 (JP) .............................. JP2017-148815

(51) Int. Cl.
C04B 35/10 (2006.01)
C04B 35/626 (2006.01)
(Continued)

(52) U.S. Cl.
CPC ........ *C04B 35/10* (2013.01); *C04B 35/62695* (2013.01); *C04B 35/64* (2013.01);
(Continued)

(58) Field of Classification Search
CPC ... C04B 35/10; C04B 35/62695; C04B 35/64; C04B 2235/3201; C04B 2235/3217;
(Continued)

(56) References Cited

U.S. PATENT DOCUMENTS

2007/0298245 A1 12/2007 Ogata et al.
2012/0227445 A1* 9/2012 Citti ...................... C04B 35/111
65/53
(Continued)

FOREIGN PATENT DOCUMENTS

JP 4-356922 A 12/1992
JP 7-237965 A 9/1995
(Continued)

OTHER PUBLICATIONS

Taiwanese Office Action and Search Report for corresponding Taiwanese Application No. 107126636, dated Apr. 24, 2019, with partial English translation.
(Continued)

Primary Examiner — Karl E Group
Assistant Examiner — Cameron K Miller
(74) Attorney, Agent, or Firm — Birch, Stewart, Kolasch & Birch, LLP

(57) ABSTRACT

An alumina sintered body comprising 0.01 to 1.0 mass % of one or more types selected from Ta, Nb, and V in terms of oxide thereof. The alumina sintered body may further comprise 0.01 to 1.0 mass % of Mg in terms of Mg oxide. It is particularly preferable that the alumina sintered body has an alumina purity of 99% or more. An alumina sintered body having low dielectric loss as compared with that in related art can therefore be produced at low cost.

14 Claims, 1 Drawing Sheet

(51) Int. Cl.
*C04B 35/64* (2006.01)
*H01L 21/67* (2006.01)

(52) U.S. Cl.
CPC .............. *H01L 21/67069* (2013.01); *C04B 2235/3201* (2013.01); *C04B 2235/3206* (2013.01); *C04B 2235/3217* (2013.01); *C04B 2235/3255* (2013.01); *C04B 2235/656* (2013.01); *C04B 2235/9669* (2013.01)

(58) Field of Classification Search
CPC ...... C04B 2235/3255; C04B 2235/656; C04B 2235/9669; H01L 21/67069
See application file for complete search history.

(56) References Cited

U.S. PATENT DOCUMENTS

| | | |
|---|---|---|
| 2014/0336035 A1 | 11/2014 | Takaoka et al. |
| 2020/0308056 A1* | 10/2020 | Miyaishi ............ C09K 3/1409 |

FOREIGN PATENT DOCUMENTS

| | | |
|---|---|---|
| JP | 8-59338 A | 3/1996 |
| JP | 9-102488 A | 4/1997 |
| JP | 2001-72462 A | 3/2001 |
| JP | 2003-112963 A | 4/2003 |
| JP | 2008-266095 A | 11/2008 |
| JP | 2013-525241 A | 6/2013 |
| JP | 2015-125896 A | 7/2015 |
| JP | 2015125896 * | 7/2015 |
| JP | 2015-163569 A | 9/2015 |
| TW | 201236990 A1 | 9/2012 |

OTHER PUBLICATIONS

Taiwanese Office Action for corresponding Taiwanese Application No. 107126636, dated Aug. 19, 2019, with partial English translation.

Written Opinion of the International Searching Authority (Form PCT/ISA/237) for International Application No. PCT/JP2018/028547, dated Oct. 30, 2018, with English translation.

Zhang et al., "Microwave dielectric properties of Al2O3 ceramics co-doped with MgO and Nb2O5," J Mater Sci: Mater Electron, vol. 26, 2015 (published online May 31, 2015), pp. 6526-6531.

* cited by examiner

ALUMINA SINTERED BODY, METHOD FOR MANUFACTURING THE SAME, AND PART FOR SEMICONDUCTOR MANUFACTURING APPARATUS

TECHNICAL FIELD

The present invention relates to an alumina sintered body, a method for manufacturing the same, and a part for semiconductor manufacturing apparatus.

BACKGROUND ART

An alumina sintered body has low dielectric loss and high heat resistance and is therefore used for a component of a process chamber of a semiconductor manufacturing apparatus (plasma processing apparatus) that etches or otherwise processes a semiconductor substrate or any other object.

In recent years, requirement for electromagnetic wave transmission has been increasingly strict, and there is a need for an alumina sintered body having lower dielectric loss.

It is known that the dielectric loss is strongly affected, for example, not only by the crystal grain diameter, porosity, impurities, and other factors of the material but particularly alkali metals (among them, Na). An alkali metal, such as Na, reacts with alumina and forms a β-alumina structure showing ion conductivity, resulting in a decrease in tan δ. To avoid the problem, the amount of Na component is reduced to improve tan δ by selecting a raw material having a small amount of Na component and volatilizing the Na component in the firing step (such as Patent Documents 1 to 3).

LIST OF PRIOR ART DOCUMENTS

Patent Document

Patent Document 1: JP4-356922A
Patent Document 2: JP8-59338A
Patent Document 3: JP9-102488A

SUMMARY OF INVENTION

Technical Problem

As a semiconductor product is further miniaturized and has an increased density, it is necessary to precisely control the etching conditions. For example, alumina used to form a component of a process chamber requires stable reduction in dielectric loss. Increasing the purity of the raw material is effective in reducing the dielectric loss.

An alkoxide method and a Bayer method have been known as a method for manufacturing alumina powder. The alkoxide method is based on chemical synthesis and therefore readily allows reduction in Na. The method involves, however, a high-cost process and is used in limited applications. On the other hand, the Bayer method uses bauxite as the raw material, involves a relatively-low-cost process, and is therefore widely used as a method for manufacturing a general-purpose raw material. To reduce the cost of a semiconductor manufacturing apparatus, it is essential to reduce the cost of alumina parts, and it is typical to use an alumina raw material manufactured by using the Bayer method.

The Bayer method, however, has a refining step in which NaOH is added and is therefore likely to have residual Na. Na is to be volatilized and eliminated, for example, in a firing process, but the degree of the effect of the Na volatilization and elimination varies in accordance with the thickness of the product and the firing conditions (such as temperature increasing speed and atmosphere). Therefore, in the case of a thick product, tan δ in a central portion of the product tends to deteriorate. Further, Na is to be eliminated also in a purification process, such as pickling, but the effect of the elimination is limited.

The present invention is based on manufacture using the Bayer method, and an object of the present invention is to produce an alumina sintered body having low dielectric loss as compared with the related art at low cost by effectively deactivating the Na component in the alumina sintered body.

Solution to Problem

The present inventors have diligently and intensively conducted studies to achieve the object and have come up with an idea that a compound that reacts with Na is added to trap Na so that the Na is deactivated and formation of the β-alumina structure is hindered. The present inventors have found that it is effective to specifically add Ta, Nb, and V in particular out of the group-V elements as the compound that reacts with Na. These elements deactivate Na based on the following reaction:

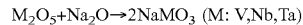
$M_2O_5+Na_2O \rightarrow 2NaMO_3$ (M: V,Nb,Ta)

It is however noted that adding Ta, Nb, and V tends to cause growth of alumina grains, resulting in a decrease in strength of the resultant product. Therefore, particularly in the case of an alumina sintered body used in an application that requires high strength, it is preferable to suppress the grain growth by adding MgO to suppress the decrease in the strength.

The present invention has been made based on the findings described above and primarily relates to an alumina sintered body, a method for manufacturing the same, and a part for semiconductor manufacturing apparatus described below.

(1) An alumina sintered body comprising 0.01 to 1.0 mass % of one or more types selected from Ta, Nb, and V in terms of oxide thereof.

(2) The alumina sintered body described in (1) further comprising 0.01 to 1.0 mass % of Mg in terms of Mg oxide.

(3) The alumina sintered body described in (1) or (2), in which the alumina sintered body has an alumina purity of 99% or more.

(4) A method for manufacturing the alumina sintered body described in any of (1) to (3), the method including mixing raw material powder of alumina with raw material powder of one or more types selected from Ta, Nb, and V, granulizing the mixture, shaping the granules, and then sintering the shaped granules in atmosphere at a temperature ranging from 1575 to 1675° C.

(5) A part for semiconductor manufacturing apparatus using the alumina sintered body described in any of (1) to (3).

Advantageous Effects of Invention

According to the present invention, the Na component of an alumina sintered body can be effectively deactivated, whereby an alumina sintered body having low dielectric loss as compared with that in the related art can be produced at low cost.

DESCRIPTION OF EMBODIMENTS

1. Alumina Sintered Body

Figure 1:
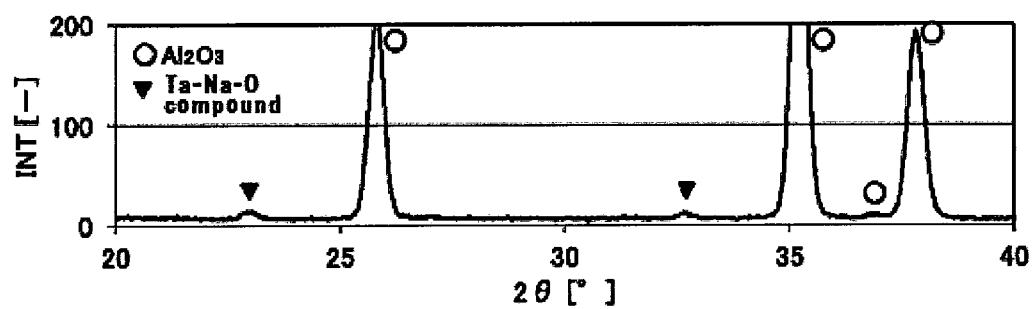
FIG. 1 shows a result of X-ray diffraction performed on an alumina sintered body in Example 1.

An alumina sintered body according to the present invention comprises 0.01 to 1.0 mass % of one or more types selected form Ta, Nb, and V in terms of oxide thereof.

Ta, Nb, and V each deactivate Na by trapping Na in the form of $NaMO_3$ (M: V, Nb, Ta) and are each therefore effective in hindering formation of the β-alumina structure. The alumina sintered body is therefore caused to comprise 0.01 mass % or more of one or more types selected from Ta, Nb, and V in terms of oxide thereof. On the other hand, when the amount of oxide of any of the elements is too large, the mechanical characteristics is adversely affected, for example, the bending strength decreases, and the resultant product cannot be used for a chamber part, which requires high purity. The upper limit of the amount of any of the elements is therefore set at 1.0 mass % in terms of oxide of the element. A preferable lower limit of the amount of oxide is 0.03%, more preferably 0.05%, still more preferably 0.1%. A preferable upper limit of the amount of oxide is 0.8%, more preferably, 0.5%.

The alumina sintered body according to the present invention is evaluated based on a reference defined as follows: the dielectric loss tangent at a frequency of 13.56 MHz is less than $5 \times 10^{-4}$. Increasing the content of one or more types selected from Ta, Nb, and V allows further decrease in dielectric loss tangent. That is, setting the content at 0.05% or more in terms of oxide thereof allows the dielectric loss tangent at the frequency of 13.56 MHz to be less than $2 \times 10^{-4}$, and setting the content at 0.1% or more in terms of oxide thereof allows the dielectric loss tangent at the frequency of 13.56 MHz to be less than $1 \times 10^{-4}$.

In the alumina sintered body according to the present invention, Na is trapped in the form of $NaMO_3$ (M: V, Nb, Ta), and an extremely small amount of Na oxide ($Na_2O$) is left accordingly. Since the group-V elements dissolve in the form of a solid solution in alumina, it is believed that the change in the crystal structure partially affects the effect described above.

The alumina sintered body according to the present invention preferably further comprises 0.01 to 1.0 mass % of Mg in terms of Mg oxide. The reason for this is that adding Ta, Nb, and V tends to cause growth of alumina grains, which causes a decrease in strength of the alumina sintered body. Particularly in the case of an alumina sintered body used in an application that requires high strength, the grain growth is preferably suppressed by adding MgO to suppress the decrease in strength. In particular, to achieve a three-point bending strength of 250 MPa or more, the content of Mg is preferably set at 0.01 mass % or more in terms of Mg oxide. On the other hand, Mg typically resolves in the form of a solid solution in alumina or is present in a sintered body as a substance that reacts with alumina. However, in a case where Mg is excessively present as particles made only of MgO in a sintered body, the particles aggregate and form a fracture origin or fall off a ground or polished surface of the sintered body, resulting in deterioration of the properties of the surface. The upper limit of the amount of Mg is therefore set at 1.0 mass % in terms of Mg oxide. A preferable lower limit of the amount of Mg is 0.03%, more preferably 0.05%, still more preferably 0.1%. A preferable upper limit of the amount of Mg is 0.8%, more preferably, 0.5%.

In particular, to achieve a three-point bending strength of 320 MPa or more, the content of Mg is preferably set at 0.1 mass % or more in terms of Mg oxide.

The amount of Na oxide in alumina can be measured by element analysis, such as a GDMS method, but it is difficult to distinguish the amount of oxide present in the form of $Na_2O$ from the amount of oxide present in the form of $NaMO_3$ (M: V, Nb, Ta). The same holds true for the amount of oxide of one or more types selected from V, Nb, and Ta (also for the amount of Mg oxide). When the amount of Na oxide present in alumina increases, relatively increasing the amount of oxide of one or more types selected from V, Nb, and Ta (further the amount of Mg oxide) allows a decrease in the amount of active Na, that is, the amount residual oxide ($Na_2O$), whereby the formation of the β-alumina structure can be hindered.

When the content of one or more types selected from Ta, Nb, and V is 0.01% or more in terms oxide thereof, the amount of oxide present in the form of $Na_2O$ can be sufficiently reduced as long as the alumina does not comprise an extremely large amount of Na (as long as the amount of Na is less than 0.0014% in terms of the total amount of Na oxide, for example). It is preferable to relatively increase the amount of oxide of one or more types selected from Ta, Nb, and V in accordance with an increase in the amount of Na. The present inventors have ascertained that even in a case where the total amount of Na oxide increases to 0.01%, increasing the amount of oxide of one or more types selected from Ta, Nb, and V to a value that falls within the range from 0.01 to 1.0 mass % can hinder the formation of the β-alumina structure. In particular, let $OX_{Na}$ (mass %) be the amount of Na oxide comprised in the alumina sintered body and $OX_O$ (mass %) be the amount of oxide of one or more types selected from Ta, Nb, and V comprised in the alumina sintered body, and the value $OX_{Na}/OX_O$ is preferably 0.20 or less. The value $OX_{Na}/OX_O$ is more preferably 0.15 or less.

The alumina sintered body according to the present invention preferably has an alumina purity of 99.0% or more. The effect of reducing dielectric loss can be maintained even when the alumina impurity is less than 99.0%, but the strength of the alumina sintered body decreases. Therefore, in the case of an alumina sintered body used in an application that particularly requires strength, the alumina purity is preferably 99.0% or more. More preferable purity is 99.3% or more, and still more preferable purity is 99.5% or more.

In the alumina sintered body according to the present invention, the remainder excluding an oxide of one or more types selected from Ta, Nb, and V (further Mg oxide) and an Na oxide is preferably substantially alumina. Examples of constituent elements other than the oxides described above may include a trace amount of Si, K, Ca, Ti, Cr, Mn, Fe, Co, Ni, Cu, Zn, Ga, Zr, Sn, Ba, and W in the form of a solid solution or a compound, such as an oxide. The alumina sintered body according to the present invention is allowed to comprise one or more types selected from the elements described above by a total content of up to 0.5% (in the case of solid solution element, the content of the element, in the case of oxide, the content in terms of oxide of the element). That is, the total content of one or more types selected from the elements described above ranges from 0 to 0.5%. The upper limit of the total content is preferably 0.15%, more preferably 0.09%, still more preferably 0.07%, and still more preferably 0.05%.

2. Method for Manufacturing Alumina Sintered Body

An example of a method for manufacturing the alumina sintered body according to the present invention will be described below.

Alumina powder as a general-purpose raw material manufactured by using a typical method, such as the Bayer method, is used as the raw material of the alumina sintered body according to the present invention. As raw materials of Ta, Nb, and V, for example, powder of oxides or nitrides thereof is used. A raw material of Mg can also be an oxide thereof or any of a variety of compounds thereof. The variety of types of powder described above are mixed with one another by using a known method, for example, by using a ball mill. That is, the variety of types of powder are mixed with one another along with water, a dispersant, a resin, and ceramic balls in a container to form slurry.

The resultant slurry is granulated by using a known method, such as spray drying. That is, an organic binder is added to the slurry, and the mixture is spray-dried with a spray dryer to form granules.

The resultant granules are shaped by using a known method, such as cold isostatic press (CIP) forming. That is, a rubber die is filled with the resultant granules and pressurized in water. In this process, the bonding force produced by the organic binder can form a primary formed body.

The resultant primary formed body is caused to undergo raw processing (green processing) into a shape close to the shape of the final product. A secondary formed body can thus be formed. The primary or secondary formed body can also be formed, for example, by sheet forming (tape forming) using a doctor blade or casting.

The secondary formed body is burned in an atmospheric furnace. In this process, when the sintering temperature is too low, densification does not proceed but pores are left, resulting in insufficient density. The sintering temperature is therefore set at 1575° C. or more. On the other hand, when the sintering temperature is too high, the alumina particles excessively grow, and a fracture source dimension increases, resulting in a decrease in strength of the secondary formed body. The sintering temperature is therefore set at 1675° C. or less. The sintering period may be set in accordance with the size of the secondary formed body and may range from 60 to 600 minutes.

Example 1

To ascertain the effect of the present invention, alumina powder as a general-purpose raw material manufactured by using a typical method, such as the Bayer method, and a predetermined powder raw material were mixed with each other along with water, a dispersant, a resin, and ceramic balls. An organic binder was added to the resultant slurry, and the mixture was spray-dried with a spray dryer to form granules. A rubber die was filled with the resultant granules and pressurized in water. The formed body produced by CIP (cold isostatic press) was heated at a temperature ranging from 1600 to 1650° C. to produce a test sintered body having the following dimensions: 150 mm in length; 150 mm in width; and 30 mm in thickness.

Test pieces were collected from the resultant sintered body, and a variety of tests were performed on the test pieces.

<Dielectric Loss Tangent (Tan δ)>

A test piece was collected from the sintered body, and samples were collected from the following three locations of the test piece: a location in the vicinity of the front surface of the test piece; a location at the center of the test piece; and a location in the vicinity of the rear surface of the test piece in the thickness direction thereof. The dielectric loss tangent of each of the collected samples at the frequency of 13.56 MHz was determined in accordance with JIS C2138, and the dielectric loss tangent of each of the collected samples at a frequency of 10 GHz was determined in accordance with JIS R1641.

<Density>

The density of the test sintered body was determined in accordance with JIS R1634.

<Bending Strength>

The three-point bending strength of the test sintered body was determined in accordance with JIS R1601.

<Element Analysis>

Element analysis of the test sintered body was performed as follows: Analysis of Ta and Na was performed by using an ICP method; and analysis of the other elements was performed by using the GDMS method, and the content of each of the elements in terms of oxide thereof was measured.

<Identification of Constituent Phase>

Figure 2:
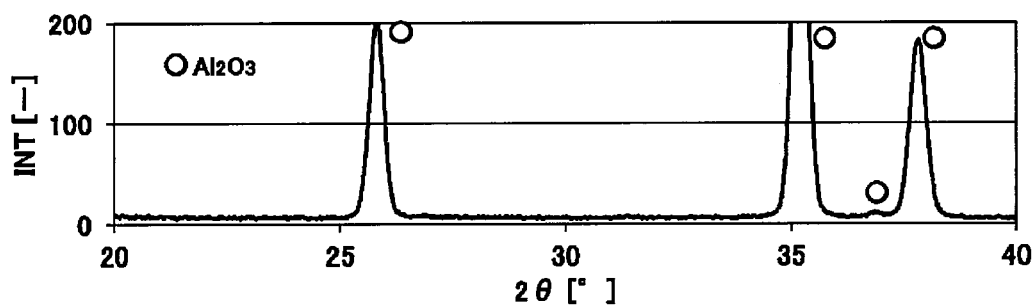
FIG. 2 shows a result of X-ray diffraction performed on an alumina sintered body in Comparative Example 1.

Identification of the constituent phase was performed on part of the test sintered bodys (Example 1 and Comparative Example 1) by using an X-ray diffractometer (manufactured by Bruker Corporation). For example, the reaction between Ta and Na can be detected by using XRD. That is, the (020) plane 2θ of $NaTaO_3$ ranges from 22.5 to 23.5°, and the (200) plane 2θ of $NaTaO_3$ ranges from 32 to 33°. FIG. 1 and FIG. 2 show results of the X-ray diffraction measurement in Example 1 and Comparative Example 1.

TABLE 1

| | | Purity of | | | | | Three-point bending | tanδ (13.56 MHz) | | tanδ (10 GHz) | |
|---|---|---|---|---|---|---|---|---|---|---|---|
| | | $Al_2O_3$ (%) | $Na_2O$ (mass %) | Group-V elements | MgO (mass %) | Relative density (%) | strength (MPa) | Average (×10⁻⁴) | At center (×10⁻⁴) | Average (×10⁻⁴) | At center (×10⁻⁴) |
| Examples | 1 | 99.8 | 0.0015 | Ta: 0.01 | 0.20 | 98.2 | 414 | 3.10 | 4.10 | 2.80 | 3.90 |
| | 2 | 99.7 | 0.0016 | Ta: 0.05 | 0.20 | 98.3 | 394 | 1.60 | 1.80 | 1.10 | 1.20 |
| | 3 | 99.7 | <0.0014 | Ta: 0.01 | 0.20 | 98.2 | 426 | 0.720 | 0.730 | 0.590 | 0.600 |
| | 4 | 99.5 | 0.0015 | Ta: 0.3 | 0.20 | 98.1 | 325 | 0.600 | 0.600 | 0.370 | 0.370 |
| | 5 | 99.3 | 0.007 | Ta: 0.5 | 0.20 | 98.1 | 298 | 0.410 | 0.410 | 0.110 | 0.110 |
| | 6 | 99.0 | 0.0015 | Ta: 0.6 | 0.40 | 98.1 | 292 | 0.320 | 0.320 | 0.091 | 0.091 |
| | 7 | 99.4 | <0.0014 | Ta: 0.5 | — | 98.0 | 243 | 0.380 | 0.390 | 0.100 | 0.100 |
| | 8 | 99.7 | 0.0017 | Ta: 0.2 | 0.05 | 98.1 | 298 | 0.500 | 0.500 | 0.140 | 0.140 |
| | 9 | 99.6 | <0.0014 | Ta: 0.2 | 0.20 | 98.2 | 363 | 0.620 | 0.620 | 0.270 | 0.280 |
| | 10 | 99.1 | 0.0016 | Ta: 0.2 | 0.70 | 98.3 | 391 | 0.900 | 0.920 | 0.680 | 0.680 |
| | 11 | 98.3 | 0.0015 | Ta: 1.0 | 0.70 | 98.1 | 287 | 0.290 | 0.290 | 0.089 | 0.089 |
| | 12 | 99.8 | 0.0015 | Nb: 0.01 | 0.20 | 98.2 | 390 | 3.80 | 4.30 | 3.10 | 4.50 |

TABLE 1-continued

| | | Purity of | | | | Relative density (%) | Three-point bending strength (MPa) | tanδ (13.56 MHz) | | tanδ (10 GHz) | |
|---|---|---|---|---|---|---|---|---|---|---|---|
| | | Al$_2$O$_3$ (%) | Na$_2$O (mass %) | Group-V elements | MgO (mass %) | | | Average (×10$^{-4}$) | At center (×10$^{-4}$) | Average (×10$^{-4}$) | At center (×10$^{-4}$) |
| | 13 | 99.3 | <0.0014 | Nb: 0.1 | 0.60 | 98.2 | 311 | 0.730 | 0.740 | 0.520 | 0.540 |
| | 14 | 99.2 | <0.0014 | Nb: 0.2 | 0.60 | 98.2 | 305 | 0.700 | 0.720 | 0.350 | 0.350 |
| | 15 | 99.1 | 0.0016 | Nb: 0.3 | 0.60 | 98.1 | 298 | 0.480 | 0.480 | 0.350 | 0.360 |
| | 16 | 98.5 | 0.0015 | Nb: 0.7 | 0.80 | 98.1 | 285 | 0.390 | 0.390 | 0.110 | 0.110 |
| | 17 | 99.4 | 0.0015 | V: 0.2 | 0.40 | 98.2 | 288 | 0.690 | 0.690 | 0.350 | 0.350 |
| Comparative Example | 1 | 99.8 | <0.0014 | 0* | 0.20 | 98.3 | 418 | 21.0 | 36.0 | 20.0 | 36.0 |

*means that the value does not fall within the range specified by the present invention.
** means the content in terms of oxide.

As shown in Table 1, in Comparative Example 1, in which the alumina sintered body does not comprise one or more types selected from Ta, Nb, and V, the dielectric loss tangent at the frequency of 13.56 MHz is more than 5×10$^{-4}$. On the other hand, in Examples 1 to 17, in each of which the alumina sintered bodys each comprise 0.01 to 1.0 mass % of one or more types selected from Ta, Nb, and V in terms of oxide thereof, the dielectric loss tangent at the frequency of 13.56 MHz is less than 5×10$^{-4}$, showing that the dielectric loss tangent falls within a satisfactory range.

As shown in FIG. 1, the result of the X-ray diffraction in Example 1 shows that there are peaks located within the range from 22.5 to 23.5°, which represents the (020) plane 2θ of NaTaO$_3$, and within the range from 32 to 33°, which represents the (200) plane 2θ of NaTaO$_3$, whereas the result of the X-ray diffraction in Comparative Example 1 shows no peak within the ranges (FIG. 2), and FIG. 1 therefore shows that a Ta—Na—O compound was produced. Example 1 therefore demonstrates that low dielectric loss is achieved by causing Ta to trap Na in the form of NaTaO$_3$.

INDUSTRIAL APPLICABILITY

According to the present invention, the Na component of an alumina sintered body can be effectively deactivated, whereby an alumina sintered body having low dielectric loss as compared with that in the related art can be produced at low cost. The alumina sintered body according to the present invention is suitable for a part for a semiconductor manufacturing apparatus, such as a component of a process chamber of a semiconductor manufacturing apparatus (plasma processing apparatus) that etches or otherwise processes a semiconductor substrate or any other object.

The invention claimed is:

1. An alumina sintered body comprising 0.01 to 1.0 mass % of one or more types selected from Ta, Nb, and V, and 0.0014 to 0.01 mass % of Na in terms of oxide thereof, wherein Na exists in the form of NaMO$_3$ (M: V, Nb, Ta), and OX$_{Na}$/OX$_0$ is 0.20 or less,
 wherein the OX$_{Na}$ (mass %) is the amount of Na in terms of Na oxide and the OX$_0$ (mass %) is the amount of oxide of the one or more types selected from Ta, Nb, and V, in the alumina sintered body.

2. The alumina sintered body according to claim 1, further comprising 0.01 to 1.0 mass % of Mg in terms of Mg oxide.

3. The alumina sintered body according to claim 1, wherein the alumina sintered body has an alumina purity of 99% or more.

4. A method for manufacturing the alumina sintered body according to claim 1, the method comprising mixing raw material powder of alumina with raw material powder of one or more types selected from Ta, Nb, and V, granulizing the mixture, shaping the granules, and then sintering the shaped granules in atmosphere at a temperature ranging from 1575 to 1675° C.

5. A part for semiconductor manufacturing apparatus using the alumina sintered body according to claim 1.

6. The alumina sintered body according to claim 2, wherein the alumina sintered body has an alumina purity of 99% or more.

7. A method for manufacturing the alumina sintered body according to claim 2, the method comprising mixing raw material powder of alumina with raw material powder of one or more types selected from Ta, Nb, and V, granulizing the mixture, shaping the granules, and then sintering the shaped granules in atmosphere at a temperature ranging from 1575 to 1675° C.

8. A method for manufacturing the alumina sintered body according to claim 3, the method comprising mixing raw material powder of alumina with raw material powder of one or more types selected from Ta, Nb, and V, granulizing the mixture, shaping the granules, and then sintering the shaped granules in atmosphere at a temperature ranging from 1575 to 1675° C.

9. A method for manufacturing the alumina sintered body according to claim 6, the method comprising mixing raw material powder of alumina with raw material powder of one or more types selected from Ta, Nb, and V, granulizing the mixture, shaping the granules, and then sintering the shaped granules in atmosphere at a temperature ranging from 1575 to 1675° C.

10. A part for semiconductor manufacturing apparatus using the alumina sintered body according to claim 2.

11. A part for semiconductor manufacturing apparatus using the alumina sintered body according to claim 3.

12. A part for semiconductor manufacturing apparatus using the alumina sintered body according to claim 6.

13. The alumina sintered body according to claim 1, wherein OX$_{Na}$/OX$_0$ is 0.14 or less.

14. The alumina sintered body according to claim 1, wherein a dielectric loss tangent at the frequency of 13.56 MHz is less than 5×10$^{-4}$.

* * * * *